United States Patent [19]

Housley

[11] Patent Number: 5,221,661

[45] Date of Patent: Jun. 22, 1993

[54] METHOD OF DEPOSITING A SUPERCONDUCTING $BI_2SR_2CACU_2O_8$ COATING ON A SUBSTRATE USING A NONSTOICHIOMETRIC PRECURSOR

[75] Inventor: Robert M. Housley, Pasadena, Calif.

[73] Assignee: Rockwell International Corporation, Seal Beach, Calif.

[21] Appl. No.: 617,435

[22] Filed: Nov. 19, 1990

Related U.S. Application Data

[63] Continuation-in-part of Ser. No. 466,175, Jan. 17, 1990, abandoned.

[51] Int. Cl.⁵ .............................................. B05D 5/12
[52] U.S. Cl. ........................................ 505/1; 505/733; 505/742; 427/62; 427/443.2
[58] Field of Search ................... 505/1, 733, 739, 782, 505/742; 427/62, 63, 430.1, 443.2

[56] References Cited

PUBLICATIONS

Akamatsu et al., "Instantaneous Preparation of Superconducting Thick Films Through Melts in the Bi-Ca-Sr-Cu-O system", Jpn. J. Appl. Phys. 27(9) Sep. 1988 L1696-1698.

Yoshimura et al., "Preparation of $Bi_2Sr_2CaCu_2O_x$ superconductors from Amphous films by rapid quenching after rapid melting", Jpn. J. Appl. Phys. 27(10) Oct. 1988 L1877-1879.

Kawaguchi et al., "X-ray diffraction study of a high-Tc Bi-Ca-Sr-Cu-O Superconductor having incommensurate Superstructure", Jpn. J. Appl. Phys. 27(6) Jun. 1988 L1015-7.

Moon et al., "High-density Bi-Pb-Sr-Ca-Cu-O superconductor prepared by rapid thermal melt processing", Appl. Phys. lett. 55(14) Oct. 1989 pp. 1466-1468.

Chen et al., "Microstructure of epitaxial $YbBa_2Cu_3O_7$ superconducting films grown by a new liquid gas-solidification technique" Appl. Phys. Lett. 53(23) Dec. 1988 pp. 2339-2341.

Gao et al. "Synthesis of Bi-Pb-Sr-Ca-Cu oxide/Ag superconductors by melt dipping and oxidation of metallic precursor alloys" Appl. Phys. Lett. 55(21) Nov. 1989 pp. 2227-2229.

Shimomura et al., "Preparation of Superconductive (Bi,Pb)-Sr-Ca-Cu-O Thick films by rapid quenching" Jpn. J. Appl. Phys. vol. 28(4) Apr. 1989 L612-614.

Prieto et al., "Formation of highly textured Bi-Sr-Ca-Cu-O superconducting thick films by a rapid melting process" Solid State Communications, vol. 69, No. 3, 1989 pp. 235-240.

Komatsu et al., "Preparation of high-Tc Superconducting Bi-Ca-Sr-Cu-O ceramics by the melt quenching method", Jpn. J. Appl. Phys. 27(4) Apr. 1988 L533-535.

Ming Xu, et al., "Highly Textured Thick Films by a Melt-Annealing Technique in the Bi-Sr-Ca-Cu-O System," Appl. Phys. Lett., vol. 55, No. 21, Nov. 20, 1989.

L. Toth, et al., "Superconducting Properties of Platelet-Aligned Thick Films of BSCCO," Abstract 4A-11, Int'l Conf. Materials and Mechanisms of Superconductivity, Jul. 1989.

Primary Examiner—Shrive Beck
Assistant Examiner—Roy V. King
Attorney, Agent, or Firm—John C. McFarren

[57] ABSTRACT

A method is provided for depositing a dense, high quality, superconducting coating on a substrate of large size and complex shape. The superconducting coating is deposited from a precursor melt that generally comprises the same constituents as the superconducting coating but not necessarily in the same proportions. The liquid precursor melt, which may bear suspended platelike crystals of the superconducting phase, flows into or through a smooth, fine-grained, porous substrate that is largely inert to the liquid precursor. The desired superconducting phase is the sole crystalline phase co-existing with the precursor melt over a range of conditions. The crystals have a pronounced platelike character and form on the substrate with their superconducting planes oriented parallel to the surfaces of the substrate. The precursor may be applied by dipping the substrate into the precursor melt at a temperature just above the liquidus, or by painting on a suspension, slurry, or paste of precursor material and heating the substrate to melt the precursor. The platelike crystals of the superconducting phase of the precursor melt form on the substrate and residual liquid flows into and through the pores of the substrate to produce a very adherent continuous film coating after cooling and annealing.

13 Claims, No Drawings

METHOD OF DEPOSITING A SUPERCONDUCTING $BI_2SR_2CACU_2O_8$ COATING ON A SUBSTRATE USING A NONSTOICHIOMETRIC PRECURSOR

This application is a continuation-in-part of application Ser. No. 466,175, filed Jan. 17, 1990, now abandoned.

TECHNICAL FIELD

The present invention relates to high $T_c$ superconductors and, in particular, to methods of depositing films of superconducting materials on substrates of large size and complex shape.

BACKGROUND OF THE INVENTION

Many potential uses of high temperature superconductors require high quality superconducting surfaces on structures of complex shape and large size. Uses of such superconducting coatings include magnetic shielding structures, microwave cavities, waveguide bandpass filters, electrically small antennas, and interconnects in phased array antenna systems. Therefore, commercial success of superconductors may depend on the discovery and perfection of efficient methods of producing high quality superconducting films and coatings.

Because of the highly anisotropic conductivity and short coherence length of superconducting oxides, effective superconduction in the high frequency systems mentioned above requires dense, highly oriented crystalline surfaces. Conventional ceramic processing techniques, however, have not produced materials with the high quality surfaces required by these systems. Furthermore, superconducting wires will not satisfy these needs even if successful production techniques are developed. Thus, there is a need for a simple and effective technique for depositing dense, high quality, oriented crystalline films and coatings of high temperature superconducting oxides on substrates of large size and arbitrary shape.

SUMMARY OF THE INVENTION

The present invention comprises a method of depositing dense, high quality, oriented crystalline coatings of superconducting films on suitable substrates of large size and complex shape. The superconducting coatings are deposited from precursor melts that generally comprise the same constituents as the superconducting coating but not necessarily in the same proportions. The precursors may include various fluxing agents and inert solvents to aid in the process.

In the method of the present invention, a liquid precursor melt, which may bear suspended platelike crystals of the superconducting phase, flows into or through a suitable porous substrate. The porous substrate should be smooth, fine-grained, and largely inert to the liquid precursor. Suitable substrates may be found among ceramics, gels, and sintered metals. The present methods have been performed successfully using a commercially available MgO ceramic as the substrate.

To obtain an effective deposition, the desired superconducting phase must be the sole crystalline phase co-existing with the precursor melt over a range of conditions. For achieving proper orientation, the crystals should have a pronounced platelike character with their superconducting planes oriented parallel to their large faces, which ultimately align parallel to the surfaces of the substrate. These conditions are well satisfied for superconductor crystals in the Bi-Sr-Ca-Cu-O system. For compositions of Bi-Sr-Ca-Cu-O with cation ratios close to 2:1:1:1.35, the 31 Angstrom, double layer, 85°K superconducting phase is the only crystalline phase co-existent with the nonstoichiometric melt over a significant temperature range below the liquidus.

In one technique of the present invention, MgO ceramic substrates are suspended by gold or silver wires and dipped into a Bi-Sr-Ca-Cu-O precursor melt held just above the liquidus at about 900° C. At this temperature, platelike crystals of the superconducting phase may be suspended in the melt. However, best results have been obtained using a melt that is initially free of suspended crystals. The MgO substrate is withdrawn from the melt and cooled slowly to allow residual liquid to flow into and through the pores of the substrate. It is believed that crystal growth occurs during the cooling process to produce a very adherent continuous film coating.

In a variation of the above technique, the Bi-Sr-Ca-Cu-O melt having cation ratios close to 2:1:1:1.35 is quenched and ground into a fine homogeneous powder. The precursor powder is then placed in liquid suspension and painted onto a desired substrate. The substrate is heated rapidly to melt the powder, held at temperature conditions favoring nucleation and growth of superconducting phase crystals, and then cooled and annealed to prevent formation of undesirable phases. The precursor powder can also be formed into a paste suitable for welding seams and joints of superconducting coatings.

The firing, quenching, and grinding steps of the precursor powder technique can be eliminated by preparing a well-mixed slurry of primary components such as $Bi_2O_3$, $SrCO_3$, $CaCO_3$, and $CuO$. The precursor slurry, like the powder suspension described above, can be painted onto the desired substrate. Thereafter, calcining, precursor melting, film deposition, cooling, and oxygen annealing of the coated substrate can be accomplished in a single temperature cycle.

DETAILED DESCRIPTION OF THE INVENTION

In the method of the present invention, superconducting coatings are deposited from precursor melts that generally comprise the same constituents as the superconducting coating but not necessarily in the same proportions. Precursors are selected for the characteristic of having platelike crystals of the superconducting phase co-existent with the precursor melt over a range of conditions. The platelike crystals can be formed on smooth, fine-grained, porous substrates that are largely inert to the liquid precursor. Suitable substrates may be found among ceramics, gels, and sintered metals.

The present invention has been performed successfully using precursors of the Bi-Sr-Ca-Cu-O system and substrate $LaAlO_3$ and of commercially available MgO ceramic. For compositions of Bi-Sr-Ca-Cu-O with cation ratios close to 2:1:1:1.35, the 31 Angstrom, double layer, 85° K superconducting phase is the only crystalline phase co-existent with the nonstoichiometric melt over a significant temperature range below the liquidus. The precursor may include various fluxing agents or inert solvents such as KCl to aid in the process.

In one technique, the MgO ceramic substrate is suspended by gold or silver wires and dipped into the precursor melt held just above the liquidus. The melt may include suspended platelike crystals of the superconducting phase, but best results from dipping have been obtained with a melt initially free of suspended crystals. After a short period of time, typically about 10 seconds, the substrate is withdrawn from the melt and cooled. Platelike crystals of the superconducting phase form on the substrate with their superconducting planes oriented parallel to the surfaces of the substrate. The liquidus temperature of the melt, normally about 900° C., depends on the oxidation state of the melt and, therefore, on the atmosphere. Thus, crystallization of the superconducting phase can be initiated at a constant temperature, for example, by changing the atmosphere from air to oxygen.

In a variation of the basic technique described above, the precursor melt is quenched and ground into a fine homogeneous powder. The precursor powder can be suspended in a liquid or formed into a paste or slurry for application to the substrate. It has also been discovered that the initial firing, quenching, and grinding steps can be eliminated by using a well-mixed slurry of primary components such as $Bi_2O_3$, $SrCO_3$, $CaCO_3$, and CuO as the precursor. Depending on the shape of the substrate, application of the precursor can be accomplished by painting it onto or pouring it over or into the substrate, accompanied by stirring, shaking, ultrasonic agitation, or differential pressure where appropriate. These techniques allow coating of parts that are too large or awkward in shape to be easily dipped into a melt. Furthermore, the precursor can be applied so as to weld superconducting components together. After the precursor is applied, the part is subjected to a temperature treatment cycle for calcination, precursor melting, film deposition, cooling, and oxygen annealing of the superconducting coating.

The deposition process has been monitored both visually and electrically. Above the liquidus, the precursor melt is substantially transparent with low viscosity. It has only moderate electrical conductivity, and the rapid buildup of polarization charges on silver electrodes suggests that this is mostly ionic. The crystals of the superconducting phase, when they appear, are black and opaque. The crystals are electrically conductive from the time they form, thereby producing a decrease in resistance and a disappearance of polarization. Crystallization of the superconducting phase to near the equilibrium extent occurs rapidly as the temperature is reduced. Microscopic examination has revealed a range of superconductor crystal morphologies and grain contact appearances depending on the cooling histories of the individual samples.

The method of the present invention produces coatings having a high degree of grain orientation. One factor in this result is the extreme growth anisotropy of the crystals, which produces dimensional ratios similar to those of playing cards. The crystals also have a strong tendency to nucleate and grow on the surface of the melt. With a proper match between precursor and substrate, the precursor melt wets the surface of the substrate without reacting to it adversely. This factor is important because it facilitates spreading and orientation of the crystals so that they conform to the shape of the substrate. Of the materials tested, commercially available MgO ceramic substrates have the best known wettability characteristics for use with the Bi-Sr-Ca-Cu-O system. Furthermore, the MgO ceramic is made from a slurry casting process that can produce a substrate of almost any desired shape.

A second factor in producing high quality coatings is that the superconducting phase must be the first phase to crystallize from the melt over a large range of conditions below the liquidus. This condition is well satisfied for superconductor crystals in the Bi-Sr-Ca-Cu-O system when the melt has cation ratios near 2:1:1:1.35.

A third factor important to the process involves the residual liquid of the precursor melt. In particular, the residual liquid must neither react with the deposited film nor deposit deleterious phases near it. The pore sizes and channel widths of the MgO ceramic are such that the residual liquid is slowly drawn into the pores after the superconducting phase has crystallized. The residual liquid then crystallizes into harmless bismuth-rich phases in the pores of the ceramic.

Scanning electron microscopy of the coatings produced by the method of the present invention confirms the structural quality of the films. Individual crystals range from tens of micrometers to hundreds of micrometers in dimension and lay flat with their c-axes normal to the surface of the substrate. Their a- and b-axes are randomly oriented but the crystals overlap or are intergrown at grain boundaries. The crystals are of uniform composition throughout with only very small amounts of extraneous phase present. The film typically are three to five micrometers thick and are bonded firmly to the substrate by a layer of bismuth-rich oxide.

PROCESS EXAMPLES

The first step in all variations of the method of the present invention is the preparation of a nonstoichiometric precursor of the 31 Angstrom, double layer, superconducting phase commonly designated $Bi_2Sr_2CaCu_2O_8$. The precursor may contain components such as $Bi_2O_3$, $SrCO_3$, $CaCO_3$, and CuO, for example, with Bi:Sr:Ca:Cu in the atomic ratios of approximately 2:1:1:1.35 rather than the stoichiometric ratios of 2:2:1:2. Experiments have shown that variations around the ratio of 2:1:1:1.35, particularly variations in the Sr:Ca ratio, also provide good results.

A nonstoichiometric precursor far from the stoichiometric region is used because the $Bi_2Sr_2CaCu_2O_8$ superconducting phase is the first and only phase to crystallize from a melt of the nonstoichiometric precursor over a range of temperatures around the liquids. Thus, in the method of the present invention, substrates with applied precursor can be held near the liquidus temperature of the melt as long as desired to obtain nucleation and growth of large, highly oriented, high quality crystals of superconducting $Bi_2Sr_2CaCu_2O_8$ on the substrate. In prior methods that use stoichiometric or near stoichiometric melts, nonsuperconducting compounds are the first to crystallize over a range of temperatures during cooling. This undesirable effect of prior methods results in deposition of relatively small, poorly oriented, imperfect crystals of the superconducting phase on the substrate.

In one variation of the basic method of the present invention, the nonstoichiometric precursor is heated to about 950° C. to form a precursor melt. The melt is held at that temperature for about an hour and visually inspected to ensure the absence of surface impurities. The temperature may then be lowered to about 925° C. before the melt is applied to a suitable substrate. Excellent results have been obtained using fine-grained, slurry cast MgO ceramic substrates of various shapes and sizes available commercially from Custom Technical Ceramics, for example. The texture and porosity of the MgO substrate enable a thin film of precursor melt to be spread uniformly over the surface of the substrate by melt dipping or painting. The wettability characteristics of the MgO substrate enable the precursor melt to form a thin film of liquid over the surface of the substrate. In the melt dipping process, excess liquid is allowed to drain off the substrate before proceeding with the thermal cycle described for nucleating and growing $Bi_2Sr_2CaCu_2O_8$ crystals.

After the nonstoichiometric precursor has been applied to the substrate, a thermal cycle is begun by holding the sample at approximately 900°–950° C. for from several minutes to several hours in a pure oxygen atmosphere. The sample is then cooled slowly to about 850° C. for nucleation and growth of $Bi_2Sr_2CaCu_2O_8$ crystals, after which the sample can be cooled rapidly to room temperature. Experiments have shown that the $Cu^+/Cu^{++}$ ratio in the precursor melt depends strongly on the ambient oxygen partial pressure. Because of this, the equilibrium melting temperature also depends on oxygen pressure. Therefore, increases in oxygen pressure can be used to initiate crystal growth. Experiments have shown that crystallization occurs satisfactorily using a wide range of cooling rates. By way of example and not limitation, the following cooling rates have produced good deposition of superconducting phase $Bi_2Sr_2CaCu_2O_8$ crystals: a) cooling from about 900° C. to about 850° C. at a rate between about 0.2° C. and 2° C. per minute; (b) cooling linearly at similar rates from 950° C. to about 850° C.; and c) cooling from about 950° C. to about 850° C. in 10° C. increments at 10 minute intervals.

The nonstoichiometric precursor of the present invention can be applied to the substrate and heat treated in several variations of the basic process described above. For example, after melt dipping, the sample can be air quenched and later reheated and cooled as describe above. In another variation, the precursor melt can be quenched to a glass, ground into a fine powder, and then formed into a slurry or paste that can be applied to the substrate and heated and cooled as described above. The step of preparing a precursor melt can be eliminated by grinding together basic components such as $Bi_2O_3$, $SrCO_3$, $CaCO_3$, and $CuO$ to form a slurry having the nonstoichiometric ratio of about 2:1:1:1.35. In this variation, the slurry is painted onto the substrate which is then calcined at about 810° C. prior to the final heating and cooling cycle. The use of precursor slurries or pastes is especially useful for coating large substrates or joining together previously coated parts. In the heat treatment cycle for samples that have been coated and quenched or prepared by applying precursor pastes or slurries, the samples need not be heated to fully melt the applied precursor. Good results have been obtained by rapidly heating such samples to the partial melting range at about 900° C., holding at that temperature for about an hour, and then cooling as described above.

The method of the present invention is useful for depositing high quality, highly oriented, phase pure films of $Bi_2Sr_2CaCu_2O_8$ superconducting oxide on substrates of complex shape and large size. The deposited superconducting crystals conform to the contours of the substrate and form an oriented layer approximately 5 micrometers thick. The critical current densities observed in superconducting films deposited by the method of the present invention are about two magnitudes higher than those reported for prior art superconducting films. In addition, the present method has been used to produce an X-band microwave cavity having Q-values higher than any previously reported for a superconducting oxide cavity.

Although the method of the present invention has been described with respect to specific substrate and precursor materials, various substitutions and combinations of these materials may be suggested to one skilled in the art based on the foregoing disclosure of the important factors in selecting such materials. Therefore, it is intended that the present invention encompass such substitutions of materials and modifications of process steps as fall within the scope of the appended claims.

I claim:

1. A method of depositing a coating of superconducting phase $Bi_2Sr_2CaCu_2O_8$ crystals on a substrate, comprising the steps of:

preparing a nonstoichiometric precursor of the superconducting coating containing Bi:Sr:Ca:Cu in the atomic ratios of approximately 2:1:1:1.35, said precursor having crystals of $Bi_2Sr_2CaCu_2O_8$ co-existent with a melt of said precursor;

heating said nonstoichiometric precursor to a temperature above a liquidus temperature of said nonstoichiometric precursor to form a precursor melt;

applying said nonstoichiometric precursor melt to the surface of the substrate;

holding the melt of said applied nonstoichiometric precursor in an atmosphere containing oxygen within a temperature range of approximately 850° C. to 950° C. near said liquidus temperature favoring nucleation and growth of said crystals of $Bi_2Sr_2CaCu_2O_8$;

nucleating and growing said crystals of $Bi_2Sr_2CaCu_2O_8$ on the substrate by cooling to about 850° C. at a rate between about 0.2° C. and 2° C. per minute to form the superconducting coating on the substrate; and rapidly cooling the substrate and superconducting coating from about 850° C. temperature.

2. The method of claim 1, wherein the step of applying said nonstoichiometric precursor comprises:

heating said nonstoichiometric precursor in a crucible to form said precursor melt;

dipping the substrate into said precursor melt in the crucible; and removing the substrate from the crucible with a film of said precursor melt adhering to the substrate.

3. The method of claim 1, further comprising the step of selecting the substrate from the group of materials consisting of ceramics, gels, and sintered metals, said group of materials characterized as fine-grained porous, and substantially inert to said precursor melt.

4. The method of claim 3, wherein the step of selecting the substrate comprises selecting from the group consisting of MgO and $LaAlO_3$.

5. A method of depositing a coating of superconducting phase $Bi_2Sr_2CaCu_2O_8$ crystals on a substrate, comprising the steps of:

preparing a nonstoichiometric precursor containing Bi:Sr:Ca:Cu in the atomic ratios of approximately 2:1:1:1.35;

heating said nonstoichiometric precursor to form a precursor melt;

quenching said precursor melt;

grinding said quenched precursor melt to produce a fine homogeneous powder;

forming said powder into a precursor slurry or paste;

applying said precursor slurry or phase to a surface of the substrate;

heating and holding said substrate in a temperature range of approximately 850° C. to 950° C. above a liquidus temperature of said applied precursor in an oxygen containing atmosphere favoring nucleation and growth of superconducting phase $Bi_2Sr_2CaCu_2O_8$ crystals;

nucleating and growing said $Bi_2Sr_2CaCu_2O_8$ crystals on the substrate by cooling to about 850° C. at a rate between about 0.2° C. and 2° C. per minute to form the superconducting coating on the substrate; and rapidly cooling the substrate and superconducting coating from about 850° C. to room temperature.

6. The method of claim 5, further comprising the step of selecting the substrate from the group of materials consisting of ceramics, gels, and sintered metals, said group of materials characterized as fine-grained, porous, and substantially inert to said precursor.

7. The method of claim 6, wherein the step of applying comprises applying said precursor slurry or paste to a joint of superconducting material for welding said joint.

8. The method of claim 6 wherein the step of selecting the substrate comprises selecting from the group consisting of MgO and $LaAlO_3$.

9. The method of claim 5, wherein the step of nucleating and growing $Bi_2Sr_2CaCu_2O_8$ crystals includes growing said crystals with their c-axes normal to the surface of the substrate.

10. A method of depositing a coating of superconducting phase $Bi_2Sr_2CaCu_2O_8$ crystals on a substrate, comprising the steps of:

preparing a precursor slurry comprising compounds of Bi, Sr, Ca, and Cu, said slurry of compounds containing Bi:Sr:Ca:Cu in nonstoichiometric ratio of approximately 2:1:1:1.35;

applying said precursor slurry to the surface of the substrate;

calcining said substrate and applied precursor below a temperature of approximately 850° C.;

heating and holding the substrate and applied precursor in a temperature range of approximately 850° C. to 950° C. above a liquidus temperature of said applied precursor in an oxygen containing atmosphere favoring nucleation and growth of superconducting phase $Bi_2Sr_2CaCu_2O_8$ crystals;

nucleating and growing said $Bi_2Sr_2CaCu_2O_8$ crystals on the substrate by cooling to about 850° C. at a rate between about 0.2° C. and 2° C. per minute to form the superconducting coating on the substrate; and rapidly cooling the substrate and superconducting coating from about 850° C. to room temperature.

11. The method of claim 10, further comprising the step of selecting the substrate from the group of materials consisting of ceramics, gels, and sintered metals, said group of materials characterized as fine-grained, porous, and substantially inert to said precursor.

12. The method of claim 11, wherein the step of selecting the substrate comprises selecting from the group consisting of MgO and $LaAlO_3$.

13. The method of claim 10, further comprising the step of annealing the superconducting coating in an atmosphere containing oxygen.

* * * * *